United States Patent
Awakura et al.

(10) Patent No.: US 6,635,819 B2
(45) Date of Patent: Oct. 21, 2003

(54) ELECTRONIC COMPONENT COMPRISING A METALLIC CASE PROVIDED WITH A MAGNETIC LOSS MATERIAL

(75) Inventors: Yoshio Awakura, Yokohama (JP); Koji Kamei, Kawasaki (JP); Satoshi Shiratori, Tokyo (JP)

(73) Assignee: NEC Tokin Corp, Miyagi (JP)

( * ) Notice: Subject to any disclaimer, the term of this patent is extended or adjusted under 35 U.S.C. 154(b) by 231 days.

(21) Appl. No.: 09/825,949

(22) Filed: Apr. 4, 2001

(65) Prior Publication Data
US 2001/0038926 A1 Nov. 8, 2001

(30) Foreign Application Priority Data
Apr. 4, 2000 (JP) .................................... 2000-102467

(51) Int. Cl.$^7$ ................................................ H05K 9/00
(52) U.S. Cl. .......................... 174/35 MS; 455/300; 257/659
(58) Field of Search .................. 174/35 MS, 35 R; 361/800, 816, 818; 179/35 GC; 455/300; 257/659

(56) References Cited

U.S. PATENT DOCUMENTS

| | | | |
|---|---|---|---|
| 4,539,433 A | * 9/1985 | Ishino et al. | 174/35 MS |
| 5,374,779 A | 12/1994 | Konishi | |
| 5,539,148 A | * 7/1996 | Konishi et al. | 174/35 R |
| 5,561,265 A | * 10/1996 | Livshits et al. | 174/35 GC |
| 5,841,067 A | * 11/1998 | Nakamura et al. | 174/35 MS |

FOREIGN PATENT DOCUMENTS

EP  0 859 378 A1  8/1998
JP  03226000 A  * 10/1991 ............ H05K/9/00

OTHER PUBLICATIONS

L.H. Chen, et al; Fe–Cr–Hf–N and Fe–Cr–Ta–N Soft Magnetic Thin Films, IEEE Transactions on Magnetics, IEEE Inc., Sep. 1997, vol. 33 No. 5, part 2 pp. 2811–3813, New York.
S.H. Han, et al; Soft Magnetic Properties of Fe–(Si3 N4, Al2 O3) Thin Films, IEEE Transactions on Magnetics, IEEE Inc., Sep. 1996, vol. 32 No. 5, pp. 4499–4501, New York.
European Search Report, Aug. 23, 2001.

* cited by examiner

Primary Examiner—Dean A. Reichard
Assistant Examiner—Carmelo Oliva
(74) Attorney, Agent, or Firm—Bradley N Ruben, PC

(57) ABSTRACT

In an electronic component (11) comprising an electronic circuit or a circuit element in a metallic case including a case (13) and a cover (39), a magnetic thin film (51) made of a magnetic loss material is provided on at least one part of an inner wall surface of the metallic case. In the magnetic loss material, its composition is represented by M-X—Y, wherein M denotes at least one of Fe, Co and Ni, X denotes at least one of elements other than M and Y, and Y denotes at least one of F, N and O. The maximum value $\mu''$max of an imaginary part $\mu''$, which is an imaginary number component of a complex permeability of the magnetic loss material, exists within a frequency range from 100 MHz to 10 GHz. A relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof. It is possible to provide an electronic component including a metallic case, which contains a high-speed operation type of semiconductor device and/or an electronic circuit and in which undesired radiation is reduced.

23 Claims, 4 Drawing Sheets

ELECTRONIC COMPONENT COMPRISING A METALLIC CASE PROVIDED WITH A MAGNETIC LOSS MATERIAL

BACKGROUND OF THE INVENTION (1) Field of the Invention

The present invention relates to an electronic component comprising a metallic case or casing, in particular, to an electronic component comprising a metallic case provided with a magnetic loss material, which uses a magnetic substance having a great magnetic loss characteristic at a high frequency and in which the magnetic substance has an excellent complex permeability characteristic effective in suppression of electromagnetic interference and undesired radiation caused by reflection or resonance of a metallic case questioned in a high-speed operation type of active element or a high frequency electronic component and an electronic apparatus.

(2) Description of the Related Art

Recently, a high-speed operation type of highly integrated semiconductor device has been spread significantly. As an example, a logic circuit element such as a random access memory (RAM), a read only memory (ROM), a microprocessor (MPU), a central processing unit (CPU), or an image processor arithmetic logic unit (IPALU) is known. In relation to these active elements, calculation speed and signal processing speed are rapidly made higher, so that an electric signal transmitting through a high-speed electronic circuit is a main cause of a dielectric high frequency noise since it is accompanied with a rapid change in electric voltage and current.

On the other hand, lightening, thinning, and miniaturizing of an electronic component and apparatus make unlimitedly rapid progress. Accordingly, the integration degree of a semiconductor device and the packaging density of an electronic component on a printed wired board are significantly made higher. Thus, tightly integrated or packaged electronic elements or signal lines are disposed extremely close to each other. This and the aforementioned high-speed signal processing would easily cause the electromagnetic interference, which affects even a high frequency, or a radiation noise.

In such a recent electronic integrated element or wired board, a problem is pointed out in relation to the undesired radiation from a current supplying line to an active element. As a countermeasure against the problem, a concentrated constant component, such as a decoupling condenser, is inserted in the current supplying line, for example.

In the high-speed electronic integrated element or wired board, however, it has occurred that the noise-countermeasure, which uses a conventional concentrated constant circuit as a prerequisite, has no effect since the signal path operates as a distributed constant due to the generated noise including a higher harmonic component.

Further, an electronic component comprising a metallic case or casing, which will be hereinafter referred to as a metallic case, has a problem that the electromagnetic interference or undesired radiation is caused by radiation or resonance of the metallic case.

SUMMARY OF THE INVENTION

It is an object of the invention to provide an electronic component comprising a metallic case in which the electromagnetic interference and undesired radiation, which are caused by the metallic case accommodating such high-seed operation type of semiconductor device and electronic circuit, are reduced.

According to the present invention, there is provided an electronic component comprising an electronic circuit or a circuit element in a metallic case. In the present invention, the metallic case is provided with a magnetic thin film made of a magnetic loss material.

Here, in the electronic component comprising a metallic case according to the invention, it is preferred that the magnetic thin film is provided in a place of the metallic case where the high frequency current passes or on at least part of an inner wall surface of the metallic case.

On the other hand, in the electronic component comprising a metallic case according to the invention, it is preferred that the magnetic thin film is made of a magnetic loss material. The magnetic loss material has a composition represented by M-X—Y, wherein M denotes at least one of Fe, Co and Ni, X denotes at least one of elements other than M and Y, and Y denotes at least one of F, N and O. The magnetic loss material is a narrow band magnetic loss material such that the maximum value $\mu''_{max}$ of an imaginary part $\mu''$ exists in a frequency range of 100 MHz to 10 GHz in complex permeability characteristics and that a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof. Otherwise, it is preferred that the magnetic thin film is made of a magnetic loss material having a composition represented by M-X—Y, wherein M denotes at least one of Fe, Co and Ni, X denotes at least one of elements other than M and Y, and Y denotes at least one of F, N and O. The magnetic loss material is a broad band magnetic loss material such that the maximum value $\mu''_{max}$ of an imaginary part $\mu''$ exists in a frequency range of 100 MHz to 10 GHz in complex permeability characteristics and that a relative bandwidth bwr is not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

DESCRIPTION OF THE PREFERRED EMBODIMENT

Figure 1:
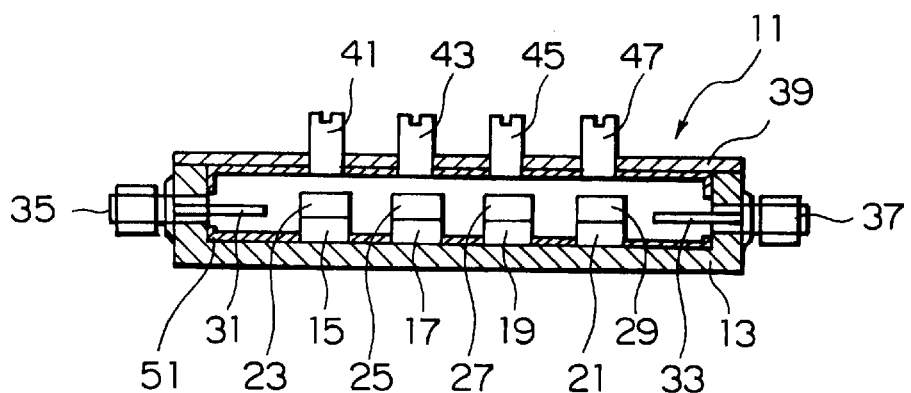
FIG. 1 is a front sectional view of a dielectric resonator filter in the first embodiment according to the invention.

Circumstances of the present invention will be described in detail before describing embodiments of the invention.

The inventors has ever invented a complex magnetic substance whose magnetic loss is large at a high frequency, and found the way of effectively suppressing undesired radiation, which is caused by the above mentioned semiconductor device or electronic circuit, by disposing the above complex magnetic substance close to a source of the undesired radiation. It is known from a recent study that the above-described operation mechanism of attenuating the undesired radiation, which uses a magnetic loss, is achieved by giving an equivalent resistivity component to the electronic circuit, which is the source of the undesired radiation. The size of the equivalent resistivity component depends on the size of the magnetic loss term or the imaginary part $\mu''$ of the magnetic substance. More particularly, the size of the resistivity component equivalently inserted to an electronic circuit is generally in proportion to $\mu''$ and the thickness of the magnetic substance when the area of the magnetic substance is fixed. Therefore, the larger $\mu''$ is required to achieve desired attenuation of the undesired radiation in the smaller or thinner magnetic substance.

For example, the magnetic imaginary part $\mu''$ was required to be an extremely large value in order to take measures against the undesired radiation by means of the magnetic loss substance in a minute area such as an inner part of a mold of a semiconductor device, so that the required magnetic substance should have had an extremely large $\mu''$ compared with the conventional magnetic loss material.

The inventors focused on the excellent permeability characteristic of a granular magnetic substance in which minute magnetic metallic particles are evenly distributed in an un-magnetic substance such as a ceramic, in a process of a study for the soft magnetic substance by means of a sputtering method or a vapor deposition method. As a result of a study for microstructure of the magnetic metallic particles and the un-magnetic substance enclosing the particle, they found that a great magnetic loss characteristic could be obtained in a high frequency range when the concentration of the magnetic metallic particles in the granular magnetic substance exists within a specific range. There have ever been many studies for the granular magnetic substance having a composition of M-X—Y, wherein M denotes a magnetic metallic element, Y denotes one of O, N or F, and X denotes an element other than M and Y, and it has been known that the granular magnetic substance has a large saturation magnetization with a lower loss. In this M-X—Y granular magnetic substance, the size of the saturation magnetization depends on the volume ratio of the M component. Thus, the ratio of the M component should be made higher in order to achieve a large saturation magnetization. For this purpose, the rate of the M component in the M-X—Y granular magnetic substance has been limited within a range capable of achieving a saturation magnetization of generally 80% or more of that of the bulk metallic magnetic substance comprising the M component alone, in a general use such that the M-X—Y granular magnetic substance is used as a magnetic core of a high frequency inductor element or a transformer.

As a result of examining in wide range the rate of the M component in the granular magnetic substance, which has a composition of M-X—Y, wherein M denotes a magnetic metallic element, Y denotes one of O, N and F, and X denotes an element other than M and Y, the inventors found that the large magnetic loss was shown in a high frequency range in any composition system when the concentration of the magnetic metallic M was in a certain range.

The highest range, in which a ratio of the M component indicates a saturation magnetization of 80% or more of that of the bulk metallic magnetic substance comprising the M component alone, is the range, which so far has been studied popularly, of the M-X—Y granular magnetic substance with a higher saturation magnetization and a lower loss. A material existing in this range is used for a high frequency micro magnetic device such as the aforementioned high frequency inductor since the material has a large value of real number part permeability ($\mu'$) and that of a saturation magnetization. The resistivity, however, is small since the rate of the X—Y components, which influences the resistivity, is low. When the film thickness becomes thick for the above reason, the permeability at the high frequency would deteriorate in accordance with the occurrence of the eddy-current loss in the high frequency range, so that the above-described material is not suitable for a comparatively thick magnetic film used as a noise-countermeasure. In a range where the ratio of the M component indicates a saturation magnetization of 80% or less and 60% or more of that of the bulk metallic magnetic substance composing the M component alone, the resistivity is comparatively large such that generally 100 $\mu\Omega\cdot$cm or more, so that the eddy-current loss would be little even when the thickness of the material is only a few $\mu$m and that the magnetic loss would be a loss almost caused by natural resonance. Thus, the frequency distribution width of the magnetic imaginary part $\mu''$ would be narrow, which is suitable for a noise-countermeasure in a range of a frequency in a narrow band (high frequency current suppression). In a range where the ratio of the M component indicates a saturation magnetization of 60% or less and 35% or more of that of the bulk metallic magnetic substance composing the M component alone, the resistivity is further larger such that generally 500 $\mu\Omega\cdot$cm or more, so that the eddy-current loss would be extremely small, and that a little magnetic interaction between M components causes larger thermal agitation of a spin and thereby fluctuation of a frequency at which natural resonance occurs. As a result, the magnetic imaginary part $\mu''$ would show a larger value in a wide range. Thus, this range of composition is suitable for suppression of high frequency current in a broad band.

On the other hand, in a range in which the ratio of the M component is further smaller than that of a range according to the invention, magnetic interaction between M components hardly occurs and thereby the range becomes super paramagnetic.

The reference for designing a material in disposing a magnetic loss material adjacent to an electronic circuit so as to suppress a high frequency current is given by a product $\mu''\cdot\delta$ of the magnetic imaginary part $\mu''$ and a thickness $\delta$ of the magnetic loss material. Generally, $\mu''\cdot\delta \geq 1000$ ($\mu$m) is required for effectively suppressing high frequency current at a few 100 MHz of frequency. Therefore, the magnetic loss material of $\mu''=1000$ is required to have a thickness of 1 $\mu$m or more. So, a material having a low resistivity in which eddy-current loss occurs easily is not preferable to be used. In the composition having a resistivity of 100 $\mu\Omega\cdot$cm or more, that is, in the composition system according to the invention, a suitable range is that the ratio of the M component indicates a saturation magnetization of 80% or less of that of the bulk metallic magnetic substance comprising the M component alone, and that the super Para magnetism would not occur, that is, the ratio of the M component indicates a saturation magnetization of 35% or more of that of the bulk metallic magnetic substance comprising the M component alone.

In view of such circumstances, the inventors have found that the above granular magnetic substance can be applied to an electronic component comprising a metallic case, and this leads to the invention.

Now, embodiments of the invention will be described with reference to drawings.

Referring to FIG. 1, there is shown a part of a structure of a dielectric resonator in an embodiment according to the invention. In this embodiment, the dielectric resonator forms a filter 11.

The filter 11 comprises dielectric resonators 23, 25, 27 and 29, each of which is provided through each of supports 15, 17, 19 and 21 on a bottom face of a metallic case 13 forming a metallic cavity. A material used for the supports 15, 17, 19 and 21 is generally such that the Q value of the dielectric resonators would not deteriorate as much as possible.

The metallic case 13 is provided on its both sides with input/output terminals 35 and 37, respectively, which comprise input/output probes 31 and 33. A metallic cover 39 is provided so as to cover an open portion of the upper end of the metallic case 13, which forms a metallic cavity. Metallic screws 41, 43, 45 and 47 for adjusting a frequency are attached to the metallic cover 39 so that a frequency can be adjusted by adjusting each interval between the dielectric resonators 23, 25, 27 and 29 and the metallic screws 41, 43, 45 and 47.

The input/output probes 31 and 33 are attached to the inside of a metallic case 15 since they are individually connected in an electromagnetic field to the dielectric resonator 23 and 29. The attachment level is almost equal to the center level of the cylindrical dielectric resonators 23 and 29 as a most suitable location for electromagnetic field connection.

The above structure is almost same as that of a conventional dielectric resonator filter.

The dielectric resonator filter in the embodiment according to the invention, however, is different from the conventional one in that a granular magnetic thin film 51 made of Feα—Alβ—Oγ is formed on the entire inner surface of the metallic case 13 and the metallic cover 39, which form a metallic cavity, by a sputtering method.

Forming the granular magnetic thin film 51 can achieve electromagnetic interference suppression and radiation suppression of undesired electromagnetic wave between components at the inside of the filter 11, or absorption of a high frequency noise from the outside.

In the above first embodiment, $Fe_\alpha$—$Al_\beta$—$O_\gamma$ is used as the granular magnetic thin film 51. The invention is defined, however, to use a magnetic substance represented by a general formula of M-X—Y, and is not limited to the above first embodiment.

Figure 2:
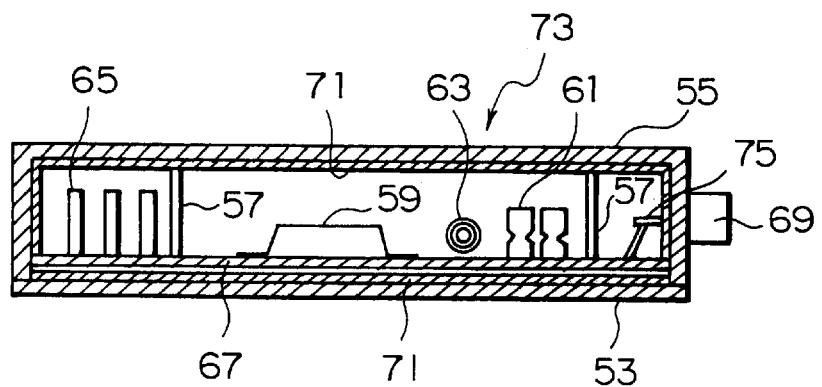
FIG. 2 is a schematic sectional view of a tuner box in the second embodiment according to the invention.

Referring to FIG. 2, in a tuner box 73 in the second embodiment according to the invention, a wired plate 67, on which electronic components such as a shield plate 57, an IC device 59, a condenser 61, an inductor 63 and a loop inductor 65 are packed, is accommodated in a metallic case comprising a metallic case 53 and a metallic cover 55. In addition, there is a phono-jack 69 provided so as to project outside the case.

The above structure is almost same as that of a conventional tuner box. The tuner box in the second embodiment according to the invention, however, is different from the conventional one in that a granular magnetic thin film 71 made of Feα—Alβ—Oγ is formed on the entire inner surface of the metallic case 53 and the metallic cover 55, which form a metallic case, by a sputtering method.

Forming the granular magnetic thin film 71 can achieve electromagnetic interference suppression between components at the inside of the tuner box 73 and radiation suppression of undesired electromagnetic wave, or absorption of a high frequency noise from the outside.

In the above second embodiment, Feα—Alβ—Oγ is used as the granular magnetic thin film 71. The invention is defined, however, to use a magnetic substance represented by a general formula of M—X—Y, and is not limited to the above second embodiment.

Next, an embodiment of a structure of an M-X—Y granular magnetic substance according to the invention and a manufacturing method thereof will be described with reference to FIG. 3.

Figure 3:
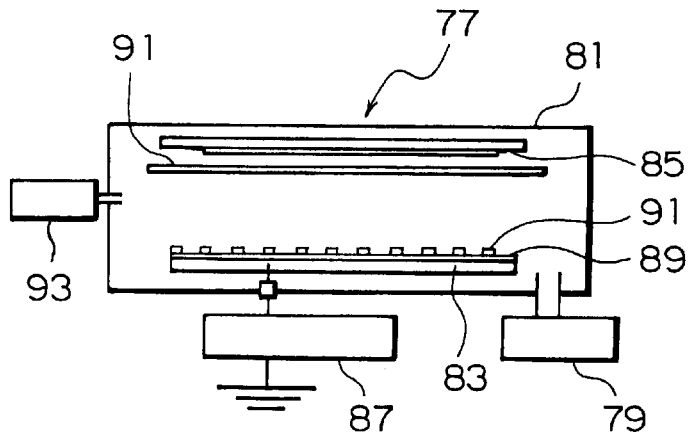
FIG. 3 is a schematic structural view of a sputtering apparatus in an embodiment according to the invention.

Referring to FIG. 3, a sputtering apparatus 77 is provided with a target sample table 83 and a substrate 85 in vacuum chamber 81 capable of being exhausted by means of a vacuum pump 79. The target sample table 83 is connected to an RE power source 87. The target sample table 83 has a target 89 and a chip 92 disposed thereon. A shutter 91 is disposed between the target sample table 83 and the substrate 85 so as to cover the substrate. A reference number 93 denotes a gas supplying portion for supplying the chamber with gas.

(Sample 1)

As shown in FIG. 3, a granular magnetic thin film is formed on the glass substrate 85 by the sputtering method under a condition shown in the table below. The sputtered thin film was heat-treated to a temperature of 300° C. for two hours in vacuum under magnetic field to obtain a sample 1.

As a result of an analysis by a fluorescent X-ray spectroscopy of the obtained sample 1, the composition of the thin film was $Fe_{72}Al_{11}O_{17}$.

The sample 1 had 2.0 μm in film thickness, 530 μΩ•cm in direct current resistivity, 18Oe ($1.42 \times 10^3$ A/m) in Hk, 16800 Gauss (1.68T) in Ms, and 148% in relative bandwidth bwr. The relative bandwidth bwr is obtained by extracting a frequency bandwidth between two frequencies at which the value of $\mu"$ is 50% of the maximum $\mu"_{max}$ and normalizing the frequency bandwidth at the center frequency thereof. The value of a ratio of the saturation magnetization of the sample 1 and that of a metallic magnetic substance comprising the M component alone was 72.2%.

TABLE 1

| Vacuum degree before deposition | <1 × 10⁻⁶ Torr (= 1.33 × 10⁻⁴ Pa) |
|---|---|
| Atmosphere upon deposition | Ar |
| Power Supply | RF |
| Target | Fe (Diameter φ: 100 mm) + Al₂O₃ chip (120 pieces) (Chip size: 5 mm × 5 mm × 2 mm t) |

μ-f response was examined in order to inspect the magnetic loss characteristic of the sample 1. The sample 1 was inserted into a detecting coil, which had been processed into a strip, and impedance was measured with the bias magnetic field impressed so that the μ-f response could be measured, and then, the frequency characteristic of the magnetic imaginary part $\mu"$ were obtained.

(Comparative sample 1)

A comparative sample 1 was produced by the same method and under the same condition as the sample 1 except that the number of an Al₂O₃ chip is set at 90.

As a result of an analysis by fluorescent X-ray spectroscopy of the produced comparative sample 1, the composition of the film was $Fe_{86}Al_6O_8$. The comparative sample 1 had 1.2 μm in thickness, 74 μΩ•cm in direct current resistivity, 22Oe (1.74×10³ A/m) in anisotropy magnetic field Hk, and 18800 Gauss (1.88T) in Ms. The value of a ratio of the saturation magnetization of the comparative sample 1 and that of the metallic magnetic substance comprising the M component alone {Ms (M-X—Y)/Ms (M)}× 100 was 85.7%.

Figure 4:
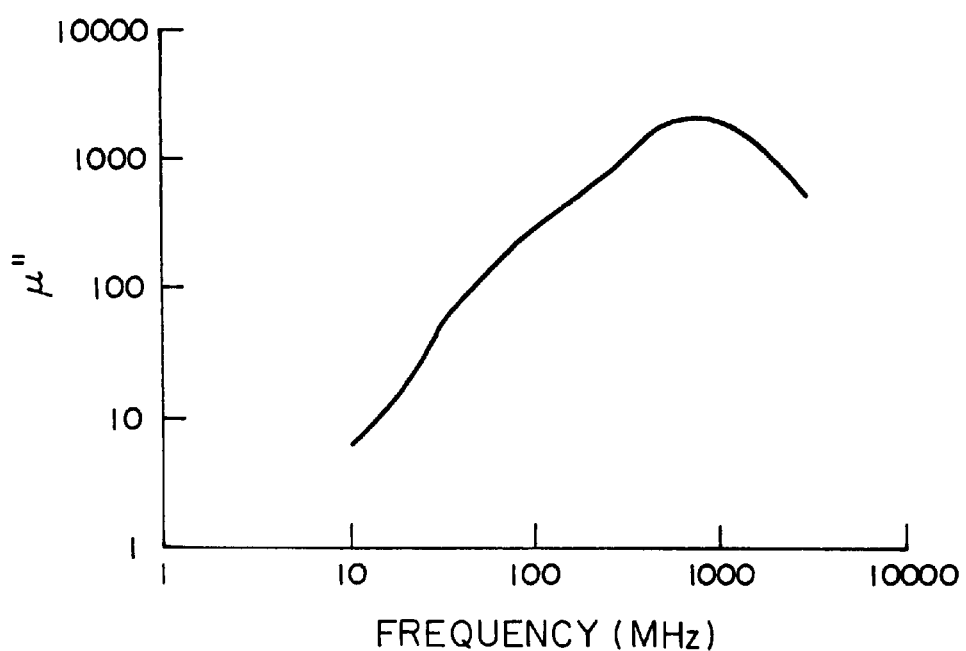
FIG. 4 shows an example of frequency dependence of $\mu''$ of a sample 1 in an embodiment according to the invention.

Referring to FIG. 4, it can be seen that the $\mu''$-f response of the sample 1 according to the invention has an extremely high peak and a rapid fall, and that the resonance frequency is as high as around 700 MHz.

Figure 5:
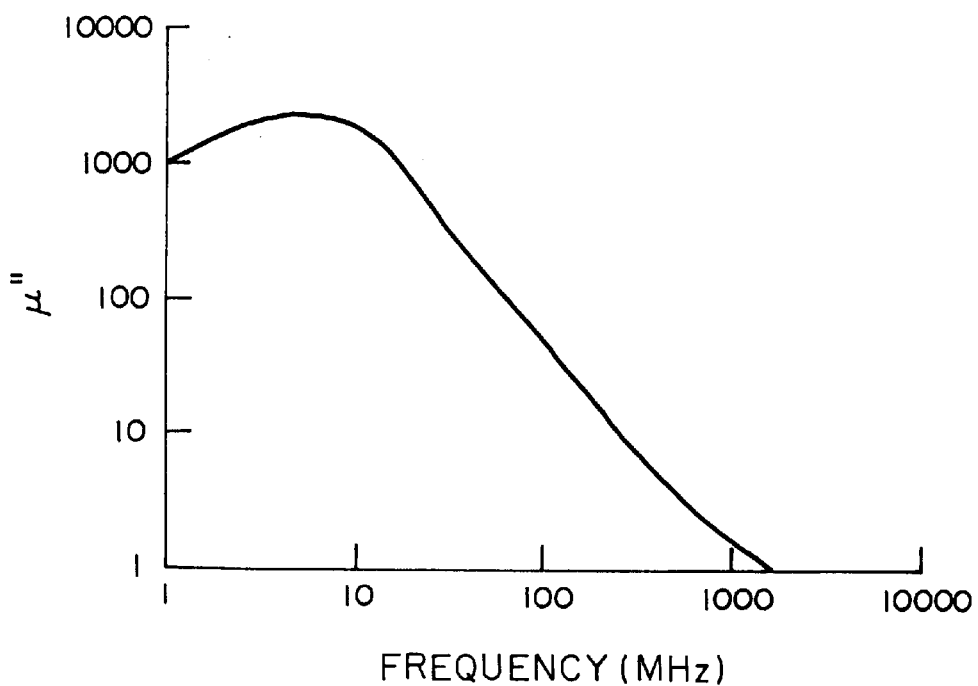
FIG. 5 shows an example of frequency dependence of $\mu''$ of a comparison sample 1.

Referring to FIG. 5, it can be seen that in the $\mu''$-f response of the comparative sample 1, the comparative sample 1 shows a large $\mu''$ in response to a large saturation magnetization Ms, while eddy-current loss occurs due to a lower resistivity of the sample as a frequency rises, and thereby the permeability (magnetic loss characteristic) in a lower frequency range appears to deteriorate, so that the permeability characteristic at a high frequency would be worse.

According to these results, it is noted that the magnetic substance of the sample 1 according to the invention shows an extremely large magnetic loss characteristic in a high frequency range.

Figure 6:
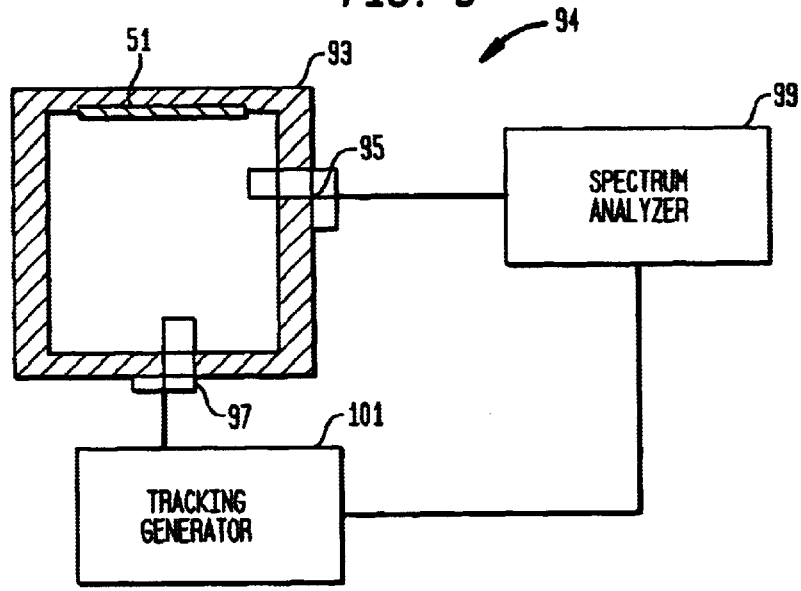
FIG. 6 shows a case resonance measuring system.

Referring to FIG. 6, in a case resonance measuring system 94, a metallic case 96, which is an object to be measured and which has a cube structure with each side being 300 mm, is considered to be a case of an electronic apparatus to be measured. The metallic case 93 is provided in its inner surface with a granular magnetic thin film 51. A terminal portion 97 is provided on one side of the inner surface, and a terminal portion 97 is provided on another side adjacent to the above side, respectively. One terminal portion 95 is connected to a spectrum analyzer 99, while the other terminal portion 95 is connected to a tracking generator 101. The spectrum analyzer 99 and the tracking generator 101 are connected to each other.

Figure 7:
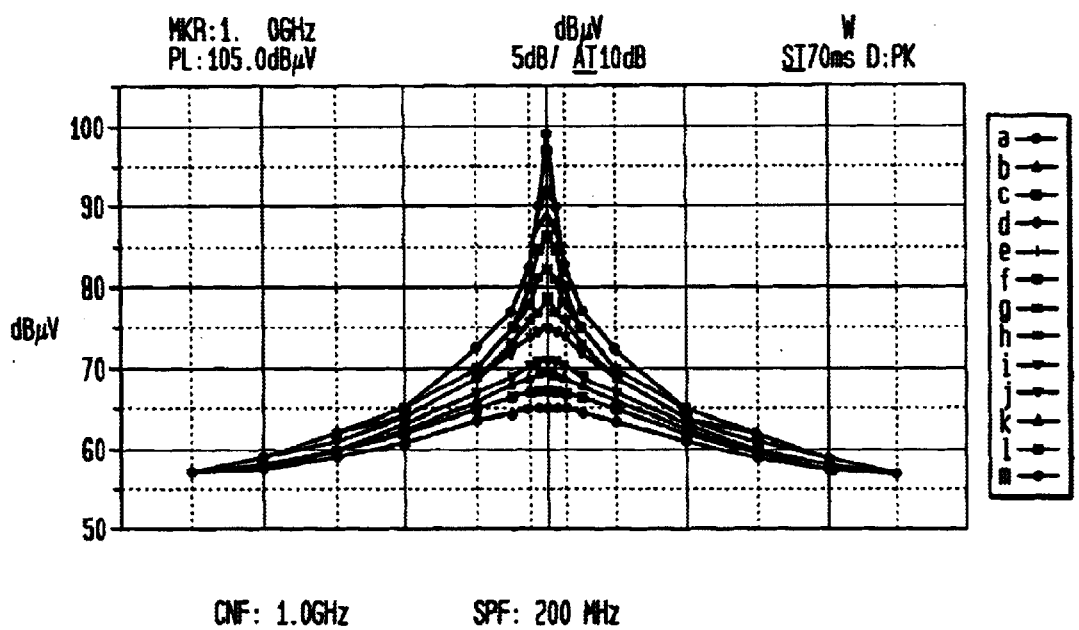
FIG. 7 shows an example of suppression and absorption material area dependence of the case resonance shown in FIG. 6.

Referring to FIG. 7, though a has never been formed, b shows an area 45×45; c shows an area 65×65; d shows an area 85×85; e shows an area 105×10⁵; f shows an area 125×125; g shows an area 145×145; h shows an area 165×165; i shows an area 185×185; j shows an area 205× 205; k shows an area 225×225; I shows an area 245×245; and m shows an area 265×265, respectively.

According to FIG. 7, it became clear that the strength of resonance depended on an area of a granular magnetic thin film.

Figure 8:
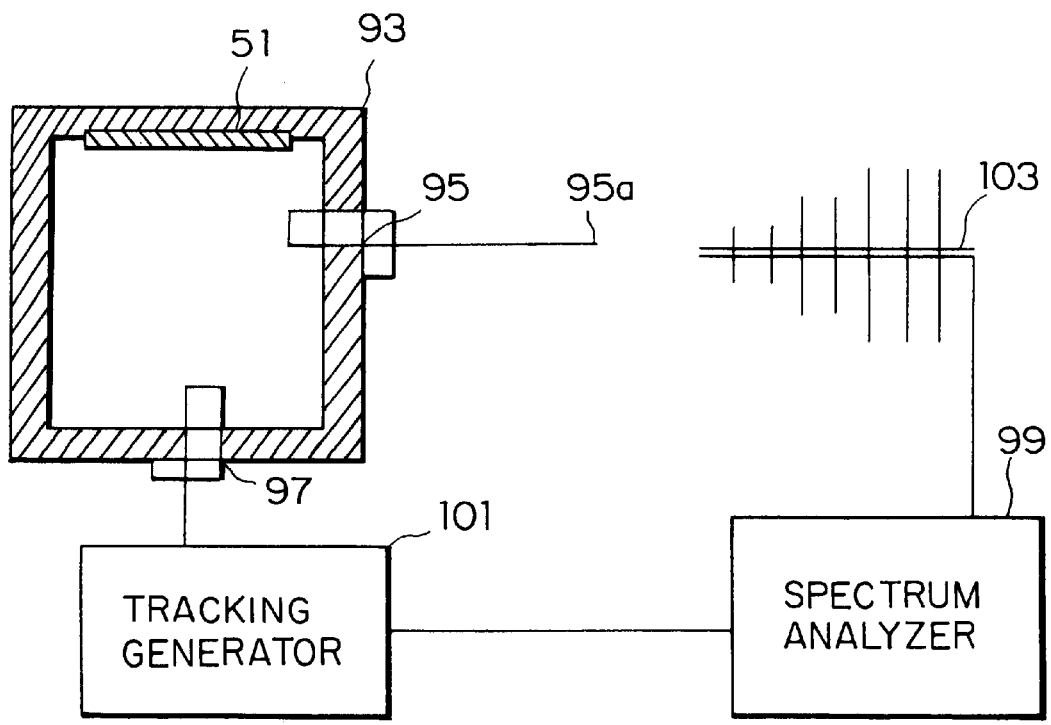
FIG. 8 is a schematic structural view of a measuring apparatus of case resonance radiation.

Referring to FIG. 8, in a case resonance radiation measuring apparatus, a metallic case 96, which is an object to be measured and which has a cube structure with each side being 300 mm, is considered to be a case of an electronic apparatus to be measured. The metallic case 96 is provided in its inner surface with a granular magnetic thin film 51. A terminal portion 95 is provided on one side of the inner surface, and a terminal portion 96 is provided on another side adjacent to the above side, respectively. One terminal portion 95 extends outside to form an open terminal 95a, while the other terminal portion 97 is connected to a tracking generator. For the measurement, a Log-periodic antenna (500 MHz–2 GHz) is used as an antenna 103 disposed in a spectrum analyzer 99 so that the top of the antenna faces to the open terminal 95a. The sample is a granular magnetic film whose size is 265×265 mm. The spectrum analyzer 99 and the tracking generator 101 are connected to each other.

Figure 9:
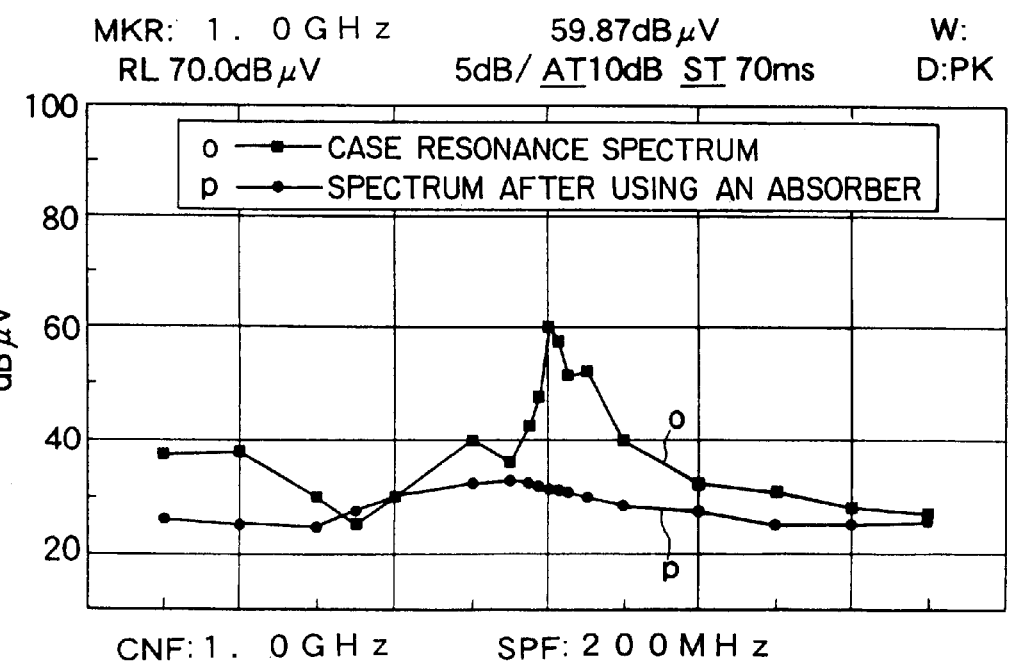
FIG. 9 shows an example that EMI radiation is suppressed due to decrease of the case resonance.

Referring to FIG. 9, a strong electric field is observed at a case resonance frequency from such as a cable, as the strength of the electric field increases in a case. It can be seen that, as a countermeasure against the above, providing a granular magnetic thin film 51 suppresses resonance of a case and also magnetic radiation to a space.

In the above description, only a granular magnetic thin film having a composition of $Fe_{86}Al_6O_8$ is mentioned. It is apparent, however, that in the granular magnetic thin film according to the invention the same effect can be obtained even when the components of a magnetic substance whose general formula is represented by M-X—Y is such that: M component is Ni, Fe or Co; X component is C, B, Si, Al, Mg, Ti, Zn, Hf, Sr, Nb, Ta or rare earth or a compound thereof; Y component is either F, N or O or a compound thereof.

As for a method of forming a film, such as vapor deposition can be adopted although the sputtering method is used in the above embodiments. Further, the forming method can be an ion beam deposition or a gas deposition. It is not limited as far as the magnetic loss material according to the invention can be evenly produced.

The dielectric resonator and tuner box are described as a metallic case in the embodiments according to the invention, but it is apparent that the invention can be applied to an electronic component comprising any other metallic case such as a personal computer accommodated in a metallic case.

As described above, according to the invention, it is possible to provide an electronic component comprising a metallic case having a magnetic thin film excellent in high frequency magnetic loss characteristic extremely effective to delete undesired electromagnetic wave of an electronic component comprising a metallic case.

What is claimed is:

1. An electronic component comprising an electronic circuit or a circuit element in a metallic case provided with a magnetic thin film made of a magnetic loss material, wherein the magnetic loss material has a composition represented by M-X—Y, wherein M denotes at least one of Fe, Co and Ni, X denotes at least one of elements other than M and Y, and Y denotes at least one of F, N, and O, and is a narrow band magnetic loss material such that the maximum value $\mu''_{max}$ of an imaginary part $\mu''$ exists in a frequency range of 100 MHz to 10 GHz in complex permeability characteristics and that a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

2. The electronic component according to claim 1, wherein the magnetic thin film is provided at a place in the metallic case, the place where the high frequency current passes.

3. The electronic component according to claim 1, wherein the magnetic thin film is provided on at lease one part of an inner wall surface of the metallic case.

4. The electronic component according to claim 3, wherein the magnetic thin film is provided on the entire inner wall surface of the metallic case.

5. The electronic component according to claim 1, wherein a saturation magnetization of the magnetic loss material is in a range from 80% to 60% of the saturation magnetization of a metallic magnetic substance comprising M component alone.

6. The electronic component according to claim 1, wherein the magnetic loss material is a narrow band magnetic loss material having a direct current resistivity in a range from 100 $\mu\Omega$•cm to 700 $\mu\Omega$•cm.

7. The electronic component according to claim 1, wherein X component of the magnetic loss material is made of at least one of C, B, Si, Al, Mg, Ti, Zn, Hf, Sr, Nb, Ta and rare earth elements.

8. The electronic component according to claim 1, wherein the M of the magnetic thin film exists in the granular form which is dispersed in a matrix of the X—Y compound.

9. The electronic component according to claim 8, wherein an average particle diameter of a granular particle M is in a range from 1 nm to 40 nm.

10. The electronic component according to claim 8, wherein the magnetic loss material is represented by a formula selected from $Fe_a$—$Al_b$—$O_g$ and $Fe_a$—$Si_b$—$O_g$.

11. The electronic component according to claim 1, wherein the magnetic loss material has an anisotropy magnetic field Hk of 600Oe ($4.74 \times 10^4$ A/m) or less.

12. The electronic component according to claim 1, wherein the magnetic loss material is formed by at least one method of sputtering and vapor deposition.

13. The electronic component according to claim 1, wherein the magnetic loss material has a thickness in a range from 0.3 μm to 20 μm.

14. An electronic component comprising an electronic circuit or a circuit element in a metallic case provided with a magnetic thin film made of a magnetic loss material, wherein the magnetic loss material has a composition represented by M-X—Y, wherein M denotes at least one of Fe, Co, and Ni, X denotes at least one of elements other than M and Y, and Y denotes at least one of F, N and O, and is a broad band magnetic loss material such that the maximum value $\mu''_{max}$ of an imaginary part $\mu''$ exists in a frequency range of 100 MHz to 10 GHz in complex permeability characteristics and that a relative bandwidth bwr is not smaller than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

15. The electronic component according to claim 14, wherein a saturation magnetization of the magnetic loss material is in a range from 60% to 35% of the saturation magnetization of a metallic magnetic substance comprising M component alone.

16. The electronic component according to claim 14, wherein the magnetic loss material is a broad band magnetic loss material having a direct current resistivity of more than 500 μΩ•cm.

17. The electronic component according to claim 14, wherein X component of the magnetic loss material is made of at least one of C, B, Si, Al, Mg, Ti, Zn, Hf, Sr, Nb, Ta and rare earth elements.

18. The electronic component according to claim 14, wherein the M of the magnetic thin film exists in the granular form which is dispersed in a matrix of the X—Y compound.

19. The electronic component according to claim 18, wherein an average particle diameter of a granular particle M is in a range from 1 nm to 40 nm.

20. The electronic component according to claim 14, wherein the magnetic loss material is represented by a formula selected from $Fe_a$—$Al_b$—$O_g$ and $Fe_a$—$Si_b$—$O_g$.

21. The electronic component according to claim 14, wherein the magnetic loss material has an anisotropy magnetic field Hk of 600Oe ($4.74 \times 10^4$ A/m) or less.

22. The electronic component according to claim 14, wherein the magnetic loss material is formed by at least one method of sputtering and vapor deposition.

23. The electronic component according to claim 14, wherein the magnetic loss material has a thickness in a range from 0.3 mm to 20 mm.

* * * * *